United States Patent [19]

DiFranco

[11] Patent Number: 5,332,486
[45] Date of Patent: Jul. 26, 1994

[54] ANTI-OXIDANT COATINGS FOR COPPER FOILS

[75] Inventor: Dino F. DiFranco, Mayfield Village, Ohio

[73] Assignee: Gould Electronics Inc., Eastlake, Ohio

[21] Appl. No.: 11,367

[22] Filed: Jan. 29, 1993

[51] Int. Cl.$^5$ ............................................. C25D 7/06
[52] U.S. Cl. ...................................... 205/50; 205/243; 205/244; 204/140; 428/607; 428/674
[58] Field of Search ............... 205/50, 243, 244; 204/140; 428/607, 674

[56] References Cited

U.S. PATENT DOCUMENTS

| Re. 30,180 | 12/1979 | Wolski et al. | 428/601 |
|---|---|---|---|
| 3,625,844 | 12/1971 | McKean | 204/140 |
| 3,853,716 | 12/1974 | Yates et al. | 204/28 |
| 4,131,517 | 12/1978 | Mitsuo et al. | 204/27 |
| 4,387,006 | 6/1983 | Kajiwara et al. | 204/32 |
| 4,456,508 | 6/1984 | Torday et al. | 204/27 |
| 4,469,567 | 9/1984 | Torday et al. | 204/50 |
| 4,952,285 | 8/1990 | Lin et al. | 204/27 |
| 5,022,968 | 6/1991 | Lin et al. | 204/28 |
| 5,057,193 | 10/1991 | Lin et al. | 204/27 |
| 5,098,796 | 3/1992 | Lin et al. | 428/607 |

FOREIGN PATENT DOCUMENTS 2030176  4/1980  United Kingdom .
2073779  10/1981  United Kingdom .

Primary Examiner—John Niebling
Assistant Examiner—Kishor Mayekar
Attorney, Agent, or Firm—Benesch, Friedlander, Coplan & Aronoff

[57] ABSTRACT

This invention relates to a method for increasing oxidation protection and decreasing the nonuniformities in an electrodeposited layer of a treated copper foil or treated copper-based alloy foil, comprising depositing a protective anti-oxidation coating onto at least one surface of said foil from a solution comprising arsenic. The invention also encompasses the copper foil or copper-based alloy foil coated to improve appearance and oxidation resistance of the foil.

15 Claims, No Drawings

ANTI-OXIDANT COATINGS FOR COPPER FOILS

BACKGROUND OF THE INVENTION

1) Field of the Invention

This invention relates to a method for improving the performance of copper foils and copper-based alloy foils having a coating on the surface of the foil to resist oxidation and to the foils produced by such a method. More specifically, the invention relates to a specific electrolyte solution for depositing an improved oxidation resistant coating on the surface of copper and copper-based alloy foils.

2) State of the Art

Copper foil is widely used in the electronic industry in the production of many electrical devices and circuits, e.g., printed circuit boards, integrated circuits, electrical contact surfaces and the like.

One of the problems which faces manufacturers of both electrolytic and wrought copper and copper alloy materials for electrical applications is the tarnishing of the materials during storage and shipment. This tarnishing generally results from the exposure of the copper to normal atmospheric conditions. This tarnishing is aesthetically unpleasant as well as a potential source of serious problems during the manufacture of many products such as printed circuits. For example, tarnishing of copper foil prior to its lamination to a dielectric substrate can affect both the bond strength between the foil and the substrate material and the etching characteristics of the resultant laminate.

In the past, tarnish resistance has been imparted to copper and copper base alloy materials by immersion of the copper material in an electrolyte containing chromate ions. U.S. Pat. No. 3,625,844 to McKean describes a method of effecting an antitarnish treatment of copper foil involving the electrolytic treatment of copper foil in an aqueous electrolyte under critical conditions of hexavalent chromium ion concentration, cathode current density, and treatment time. U.S. Pat. No. 3,853,716 to Yates et al. discusses the McKean process and points out that it is not a completely satisfactory antitarnishing technique because a build-up of copper and chromium cations in the electrolyte bath interfere with the effectiveness of the antitarnish treatment. Yates et al. attempt to overcome this problem by rendering the copper material cathodic as it passes through an aqueous electrolyte containing hexavalent chromium ion-containing anions while the aqueous electrolyte is of sufficient alkalinity to cause precipitation of copper and chromium cations. U.S. Pat. Nos. 4,131,517 to Mitsuo et al. and 4,387,006 to Kajiware et al. illustrate still other chromate containing treatments for suppressing time-dependent changes in color tone during storage. Still other antitarnish treatment techniques are illustrated in U.K. published patent applications 2,030,176A and 2,073,779A.

The purpose of the above-discussed antitarnish layer is to prevent oxidation or tarnishing of the copper foil which, as previously pointed out, is not only unpleasant in appearance, but also is an indication of a reacted or nonpure copper foil surface. In addition to the techniques referred to above, the layer can be applied through a dip or electroplating process, and the material used can be organic, inorganic or a combination of the two.

As laminating and processing conditions have changed over the years, so too have the demands on the stabilizer, i.e., antitarnish treatment, performance. Presently, laminators require that the foil show no discoloration after lamination and subsequent processing. In the United States, this means that the foil must withstand temperatures of 180°–190° C. for one hour, however, as laminators begin to use higher Tg resin systems and continuous lamination processes, the foil will have to withstand 250° C. for $\frac{1}{2}$ hour.

Present stabilization schemes involve the deposition of a zinc layer onto the copper foil followed by a chromate conversion reaction to form a zinc-chromate layer on the foil. The layer is stable but often nonuniform. Nonuniformity is manifested on a macro-scale by the appearance of bands and streaks, and on the micro-scale by the appearance of small spots. As a means of increasing oxidation protection and decreasing the nonuniformities observed in the stabilization layer, a silane or similar material can also be applied to the foil surface on top of the zinc-chromate layer.

It is known in the art that a chromium-zinc compound forms a satisfactory anti-tarnish coating for copper and copper base alloys. One such commercial coating has the composition 10 atomic % Zn; 5% Cr; 37% O; 46% C and 2% Cu. The coating is readily removed with a 4% HCl solution.

Examples of such stabilization schemes and treatment processes are disclosed in U.S. Pat. Nos. 4,952,285, 5,022,968, 5,057,193 and 5,098,796. Also U.S. Pat. No. 4,456,508 discloses multilayer treatment of copper foil for the primary purpose of improving bond strength of the foil with a base material.

SUMMARY OF THE INVENTION

This invention relates to a method for increasing oxidation protection and decreasing the nonuniformities in an electrodeposited layer of a treated copper foil or treated copper-based alloy foil, comprising depositing a protective anti-oxidation coating onto at least one surface of said foil from a solution comprising arsenic. The invention also encompasses the copper foil or copper-based alloy foil coated to improve appearance and oxidation resistance of the foil.

DETAILED DESCRIPTION OF THE PREFERRED EMBODIMENTS

The present invention utilizes arsenic in an electroplating treatment process to provide oxidation protection to a copper foil or copper-based alloy foil. The inclusion of arsenic improves the uniformity of the coating. The uniformity is illustrated visually by bands or streaks on the macro-scale and by small spots on the micro-scale. With the inclusion of arsenic, the method is less sensitive to flow variations of the electrolyte and foil line speed.

The copper foil or copper-based alloy foil may be any foil, such as those used in the electronic industry to produce electrical devices and circuits. As used herein, the term copper foil and copper-based alloy foil includes copper and copper-based alloy sheet, strip, foil and slab materials. The foils may be used to form printed circuit boards, integrated circuits, etc. The foils and methods of their manufacture are known to those in the art and may comprise any electroformed or wrought copper foil or copper-based alloy foil.

The copper foil or copper-based alloy foil is treated by depositing a coating onto the surface of the foil from a solution containing arsenic. The coating is generally deposited using a current density from about 1 up to about 50 ASF, preferably from about 15 to about 30 ASF, more preferably about 20 ASF. In one embodiment, the current density is no greater than 25 ASF.

The arsenic is included in the solution at a concentration of about 5 ppm to about 400 ppm, preferably about 100 ppm to about 200 ppm, and more preferably about 100 ppm to about 150 ppm. The arsenic is added to the solution or electroplating bath and is preferably in a pentavalent oxidation state. Examples of useful arsenic compounds which may be added to the baths are arsenic acid, orthoarsenic acid, and pryo-arsenic acid and the salts of these acids.

The arsenic is included in a coating solution or electroplating bath such as a sulfate solution or succinate coating solution. An example of a useful coating solution is a zinc-chromate coating solution. The coating produced on the surface of the foil from such solution is a zinc-chromate coating. The chromate is included in the solution in any soluble form. An example of a useful chromate is chromium (VI) oxide. The zinc may be present in any soluble form, such as zinc oxide or zinc sulfate.

As described above, the coating solution or electroplating bath may be formulated from a variety of materials and/or electrolytes. In one embodiment, the coating solution is a succinic acid bath. The succinic acid is generally present in an amount from about 2.5 g/l up to about 7.5 g/l, preferably about 4 g/l up to about 6 g/l, and more preferably about 5 g/l. Chromium is generally present in the solution at a level from about 0.075 g/l up to about 1.0 g/l, preferably about 0.10 g/l to about 0.50 g/l, more preferably about 0.30 g/l. In one embodiment, the zinc is generally present in an amount from about 0.45 g/l up to about 1.8 g/l, preferably about 0.70 g/l to up to about 1.1 g/l, and more preferably about 0.91 g/l.

In another embodiment, the coating bath is a sulfate coating solution. In this embodiment, the chromium is present in an amount from about 0.2 g/l up to about 1.5 g/l, preferably about 0.30 g/l up to about 0.75 g/l, and more preferably about 0.50 g/l. An example of a useful form of zinc is zinc sulfate heptahydrate. Generally, zinc is present in an amount from about 0.10 g/l up to about 2 g/l, preferably about 0.20 g/l up to about 0.60 g/l, and more preferably about 0.45 g/l. Sodium sulfate is generally present in an amount from about 5 g/l up to about 15 g/l, preferably about 7.5 g/l up to about 12 g/l, and more preferably about 10 g/l.

While a zinc-chromate stabilizer coating, i.e., antioxidant/antitarnish coating, is a preferred coating solution for the present invention, it is pointed out that other electroplating coating solutions or baths will also be operable within the scope of the present process. For example, pentavalent arsenic compounds may be used with such electroplating coating solutions as brass, zinc, nickel, gold, platinum, bronze, tin and the like.

For the purposes of the present invention the pH of the solution generally is acidic, e.g., less than 7.0. In one embodiment, the pH is less than 5.5, and preferably less than 5.

The present invention also contemplates a treated copper foil or copper-based alloy foil which has a uniformity rating in the range of about 95% to about 100% and an HTO rating at 250° C. for 15 minutes of about 1.0 to about 2.0. In one embodiment, the foil has an HTO rating in the range of from about 1.0 to about 1.5. In another embodiment, the foil has a uniformity rating of 100%. Generally, the coated foil comprises from about 0.1 $\mu g/dm^2$ up to about 20 $\mu g/dm^2$ of arsenic, preferably from about 5 $\mu g/dm^2$ up to about 10 $\mu g/dm^2$.

To further illustrate the process according to the present invention, the following examples will serve to show the operation and advantages of the invention. These examples, however, should not be considered as a limitation upon the scope of the present invention where such scope is defined only by the claims.

EXAMPLE 1

The shiny surface of 1 oz. copper foil was treated with anti-oxidant coating by immersion in an electrolyte solution having an anode disposed therein. The following sets forth the composition of the solution:

| | |
|---|---|
| Cr | 0.150 g/l |
| Zn | 0.90 g/l |
| Succinic Acid | 5.0 g/l |
| Arsenic Acid | 100 ppm (As) |

The solution has a pH of 4.5 and was maintained at a temperature of 35° C. A current density of 25 ASF is imposed on the foil to effect the electroplating of the coating onto the surface of the copper foil. The plating time was 5 seconds.

The coated foil was tested for high temperature oxidation (HTO) resistance. The coated foil was baked at 250° C. for 15 minutes. Afterwards the tested treated foil is rated. A rating of 1.0 indicates no change after testing while a rating of 5.0 indicates complete oxidation. The surface of the baked or heated foil is compared with the surface of a foil sample which has not been heat-treated. If the surface of the heat-treated foil exhibits no discoloration or staining relative to the surface of a foil sample, which has not been heat-treated or baked, the rating is 1.0. Conversely, if the surface of the foil is completely discolored after heat-treatment, the rating is 5.0. Intermediate ratings are given to heat-treated foils depending upon the degree of discoloration of the surface. The tested foil treated according to the method of the present invention as set forth above gave a rating of 1.0.

The same foil was also rated for uniformity where the rating ranges from 0% (worst) to 100% (best). This rating correlates to the above-discussed HTO rating in that an HTO rating of 1.0 generally indicates a uniformity rating of 100% and represents the measure of the percentage of the foil surface that is not oxidized after heat treatment. Thus, this rating is also based on the degree of discoloration or lack thereof. The foil treated according to this example gave a uniformity rating of 100%.

EXAMPLE 2

A copper foil was treated according to the process set forth in Example 1. For this example the composition of the electrolyte solution was:

| | |
|---|---|
| $CrO_3$ | 1.0 g/l |
| $ZnSO_4.7H_2O$ | 1.98 g/l |
| $Na_2SO_4$ | 10 g/l |
| $HAsO_3$ | 150 ppm (As) |
| pH | 4.5 |
| Temperature | 35° C. |

The treated foil according to this Example was tested as in Example 1 and was shown to gave an HTO rating of 1.0 and a uniformity rating of 100%.

EXAMPLE 3

The process of Example 1 was also followed to treat the surface of copper foil to provide an anti-oxidant coating on the surface of the foil. The composition of electrolyte solution for this Example is set forth below:

| | |
|---|---|
| $CrO_3$ | 1.0 g/l |
| ZnO | 1.18 g/l |
| Succinic Acid | 5 g/l |
| Arsenic Acid | * |

*The concentration of the arsenic was varied for this example and is set out below in Table I along with the corresponding HTO rating.

The pH of the solution for this example was 4.5, the temperature of the solution was maintained at 35° C. and the current density applied was 23 ASF for 5 seconds.

TABLE I

| Sample No. | Arsenic (ppm) | HTO Rating 250° C. for 15 min. |
|---|---|---|
| 1 | 0 | 2.0 |
| 2 | 100 | 1.5 |
| 3 | 125 | 1.0 |
| 4 | 150 | 1.1 |
| 5 | 175 | 1.7 |
| 6 | 200 | 1.8 |
| 7 | 250 | 1.8 |

EXAMPLE 4

For this example the process of Example 1 was also followed, however, the following composition was employed to make up the electrolyte solution.

| | |
|---|---|
| $CrO_3$ | 0.3 g/l |
| ZnO | 1.12 g/l |
| Succinic Acid | 5 g/l |
| Arsenic Acid | * |

*For this example the arsenic concentration was varied to further illustrate the dramatic improvement in HTO protection and uniformity achieved by the process of the present invention. These results are set forth below in Table II.

The pH of the solution was 4.5 and the temperature of the solution was maintained at 35° C.

TABLE II

| Sample No. | Arsenic (ppm) | Current Density (ASF) | HTO Rating (250° C. for 15 min.) | Uniformity Rating % |
|---|---|---|---|---|
| 1 | 0 | 20 | 2.5 | 0 |
| 2 | 0 | 22 | 2.5 | 0 |
| 3 | 0 | 24 | 3 | 5 |
| 4 | 100 | 20 | 1.8 | 30 |
| 5 | 100 | 22 | 1 | 100 |
| 6 | 100 | 24 | 1 | 100 |
| 7 | 200 | 20 | 1.2 | 95 |
| 8 | 200 | 22 | 1 | 100 |
| 9 | 200 | 24 | 1 | 100 |
| 10 | 300 | 20 | 1 | 100 |
| 11 | 300 | 22 | 1 | 100 |
| 12 | 300 | 24 | 1.1 | 99 |
| 13 | 400 | 20 | 1 | 100 |
| 14 | 400 | 22 | 1 | 100 |
| 15 | 400 | 24 | 1 | 100 |

As illustrated by the foregoing examples, employing arsenic in the electroplating bath within a specified concentration range results in the improved performance of antioxidant coatings on copper foil. This is clearly indicated by the HTO and Uniformity ratings for the foils tested. Additionally, it has been discovered that the presence of arsenic in the electroplating bath will result in a lower current density required to electroplate the antioxidant coating onto the surface of the copper foil or copper-based alloy foil. For example, in the absence of arsenic, the process requires to be operated at greater than 50 ASF, however, in the presence of arsenic, a current density of 20 ASF is sufficient.

While the invention has been described and illustrated above with reference to specific preferred embodiments thereof, those skilled in the art will appreciate that various changes, modifications and substitutions may be made therein without departure from the spirit of the invention. For example, various different concentrations for each of the components of the composition of the electroplate solution as well as different operating conditions other than the preferred parameters, amounts or materials set forth hereinabove may be applicable as a consequent of the nature of the various components employed in the process and such other expected various or differences or results are contemplated in accordance with the practices of the present invention. It is intended, therefore, that the invention be limited only by the scope of the claims that follow.

I claim:

1. A method for increasing oxidation protection and decreasing the nonuniformities in an electrodeposited layer of a treated copper foil or treated copper-based alloy foil, comprising electrodepositing a protective anti-oxidation coating onto at least one surface of said foil from a solution comprising ions of chromium and arsenic.

2. The method according to claim 1 wherein said arsenic is present in solution in the pentavalent oxidation state and in a concentration range of about 5 ppm to about 400 ppm.

3. The method according to claim 2 wherein arsenic is added to said bath as arsenic acid, ortho-arsenic acid or pyro-arsenic acid.

4. The method according to claim 2 wherein said arsenic is present in the concentration range of about 100 ppm to about 200 ppm.

5. The method according to claim 4 wherein said concentration of arsenic is about 150 ppm.

6. The method according to claim 1 wherein said anti-oxidation coating is deposited on wrought copper foil or copper-based alloy foil.

7. The method according to claim 1 wherein said anti-oxidation coating is deposited on electroformed copper foil or copper-based alloy foil.

8. The method according to claim 1 wherein said anti-oxidation coating further contains zinc.

9. The method according to claim 1 wherein said coating is applied to said surface of said foil by electroplating at current density of no greater than 25 ASF.

10. The method according to claim 9 wherein said anti-oxidation coating comprises about 0.1 $\mu g/dm^2$ to about 20 $\mu g/dm^2$ of arsenic.

11. A treated copper foil or copper-based alloy foil having on at least one surface thereof an electrodeposited anti-tarnish layer comprising chromium and a minor effective amount of arsenic said minor effective amount of arsenic being effective to provide said foil improved appearance and resistance to oxidation wherein said foil exhibits increased oxidation resistance as indicated by an HTO rating of about 1.0 to about 2.0 measured at 250° C. for 15 minutes and improved appearance as indicated by a uniformity rating of about 95 percent to about 100 percent wherein said foil is produced by the method of claim 1.

12. A copper foil having on at least one surface thereof an electrodeposited anti-tarnish layer comprising chromium and a minor effective amount of arsenic said minor effective amount of arsenic being effective to provide said foil improved appearance and resistance to oxidation wherein said foil exhibits increased oxidation resistance as indicated by an HTO rating of about 1.0 to about 2.0 measured at 250° C. for 15 minutes and improved appearance as indicated by a uniformity rating of about 95 percent to about 100 percent.

13. A foil according to claim 22 wherein said anti-tarnish layer further comprises a major amount of zinc and said layer is adjacent to a shiny side of said copper foil.

14. The foil according to claim 11 wherein said HTO rating is in the range of about 1.0 to about 1.5 and said uniformity rating is about 100%.

15. The foil according to claim 11 wherein said coated foil comprises from about 5 µg/dm² to about 10 µg/dm² of arsenic.

* * * * *